(12) United States Patent
Feenan et al.

(10) Patent No.: US 6,788,060 B1
(45) Date of Patent: Sep. 7, 2004

(54) IMAGING SYSTEM WITH HOMOGENEOUS MAGNETIC FIELD

(75) Inventors: Peter Feenan, Witney (GB); Rory Warner, Oxford (GB); William F. B. Punchard, Sudbury, MA (US); Piotr M. Starewicz, Somerville, MA (US)

(73) Assignee: GE Medical Systems Global Technology Co., Inc., Waukesha, WI (US)

( * ) Notice: Subject to any disclaimer, the term of this patent is extended or adjusted under 35 U.S.C. 154(b) by 0 days.

(21) Appl. No.: 10/250,014

(22) Filed: May 28, 2003

(51) Int. Cl.[7] .................................................. G01V 3/00
(52) U.S. Cl. ...................................... 324/320; 324/319
(58) Field of Search ................................ 324/320, 319, 324/318, 322, 309, 307, 300

(56) References Cited

U.S. PATENT DOCUMENTS

| | | |
|---|---|---|
| 4,862,087 A | 8/1989 | Hillenbrand |
| 4,949,043 A | 8/1990 | Hillenbrand |
| 4,949,044 A | 8/1990 | Starewicz |
| 5,101,638 A * | 4/1992 | White ........................ 62/51.1 |
| 5,136,243 A | 8/1992 | Starewicz |
| 5,313,164 A | 5/1994 | Starewicz |
| 5,864,275 A | 1/1999 | Ohashi |
| 5,963,117 A | 10/1999 | Ohashi |
| 6,198,283 B1 | 3/2001 | Foo |
| 6,252,405 B1 * | 6/2001 | Watkins et al. .............. 324/319 |
| 6,448,772 B1 * | 9/2002 | Aoki .......................... 324/307 |
| 6,455,855 B1 | 9/2002 | Kwasnick |
| 6,507,190 B1 | 1/2003 | Hinks |
| 6,522,144 B2 | 2/2003 | Boskamp |

* cited by examiner

Primary Examiner—Louis Arana
(74) Attorney, Agent, or Firm—Michael Dellapenna

(57) ABSTRACT

An imaging system 10 is provided comprising an imaging magnet 16 having a magnet bore 18. A plurality of passive shims 26 is positioned within the magnet bore 18. A plurality of resistive shims 46 is also positioned within the magnet bore 18. A plurality of thermometers 28 is coupled thermally to a select number of the plurality of passive shims 26 and read a passive shim temperature 36. A controller 32 is in communication with the plurality of thermometers 28 and the plurality of resistive shims 46. The controller 32 includes logic adapted to adjust control currents 40 sent to each of the plurality of resistive shims 46 in response to the resistive shim temperatures 36 received from each of the thermometers 28 such that the strength of the magnetic field and its homogeneity is maintained.

20 Claims, 2 Drawing Sheets

IMAGING SYSTEM WITH HOMOGENEOUS MAGNETIC FIELD

BACKGROUND OF INVENTION

The present invention relates generally to Magnetic Resonance Imaging (MRI) systems, and more particularly, to a method and system for maintaining the homogeneity of a magnetic field within the imaging system over a range of passive shim temperatures.

Magnetic Resonance Imaging (MRI) often relies on a homogeneous magnetic field in order for improvement of the resultant medical images. In order to develop the desired homogeneous magnetic field, it is common for ferromagnetic elements used as passive shims to be placed within the bore of the imaging magnet. Often, these passive shims are supplemented through the use of electrically powered field correction coils, frequently referred to as resistive shims in order to increase their ability to affect the magnetic field. The position of the passive shims must be carefully chosen such that their effect on the magnetic field results in a more homogeneous field.

Although the passive shims have been successful in improving magnetic field homogeneity, it is known that many passive shims, such as iron pieces, may be effected by temperature. As the imaging system is operated, the passive shims may experience changes in temperature. For many passive shims, this change in temperature may effect the magnetization of the shims and thereby affect the magnetic field. This not only changes the strength of the magnetic field within the bore, but the field may also become less homogenous as the temperature of the passive shims varies. This negative impact on the homogeneity of the magnetic field can result in a loss of image quality.

One approach to eliminating the impact of passive shims, such as iron, on the magnetic field has been to minimize the amount of materials such as iron utilized. This runs counter to the positive benefits provided by the iron or similar shims when thermally stable. Other approaches have turned to alternative shimming solutions such as superconductive coils. These alternative solutions, however, often are associated with expensive implementation costs that work against their suitability or practicality.

It would, therefore, be highly desirable to have a magnetic resonance imaging assembly with improved control over magnetic field homogeneity. It would additionally be highly desirable to have such improved control over magnetic field homogeneity without the costs associated with many known alternative shimming solutions.

SUMMARY OF INVENTION

An imaging system is provided comprising an imaging magnet having a magnet bore. A plurality of passive shims is positioned within the magnet bore. A plurality of resistive shims is also positioned within the magnet bore. A plurality of thermometers are coupled thermally to a select number of the plurality of passive shims and read a passive shim temperature. A controller is in communication with the plurality of thermometers and the plurality of resistive shims. The controller includes logic adapted to adjust control currents sent to each of the plurality of resistive shims in response to the passive shim temperatures received from each of the thermometers such that magnetic homogeneity is maintained. Other features of the present invention will become apparent when viewed in light of the detailed description of the preferred embodiment when taken in conjunction with the attached drawings and appended claims.

DETAILED DESCRIPTION

Figure 1:
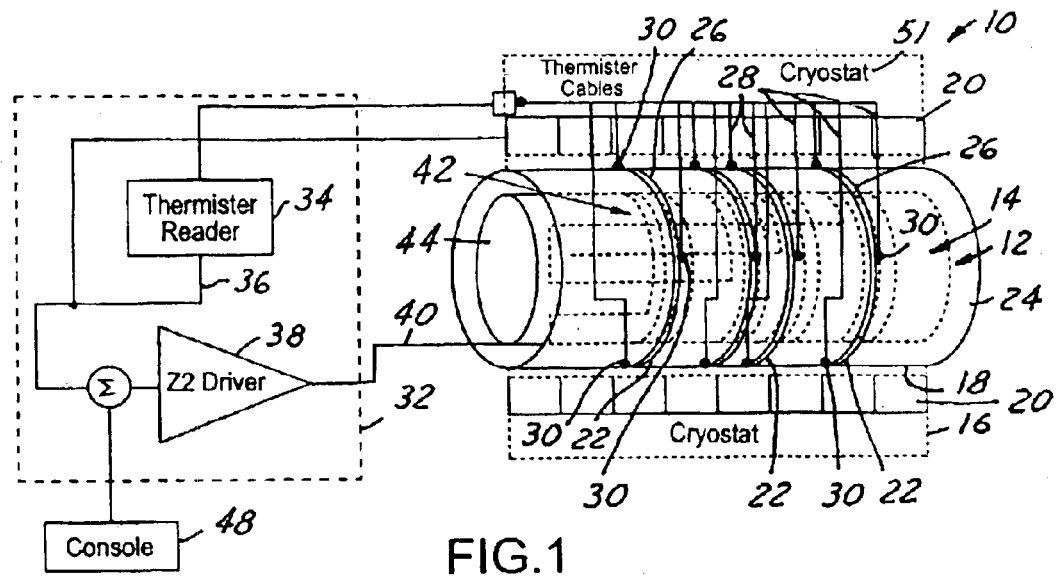
FIG. 1 is an illustration of a medical imaging system in accordance with one embodiment of the present invention.

The present invention comprises an imaging system 10, specifically a magnetic resonance imaging system, designed to monitor temperature changes within a passive shim assembly 12 and to provide feedback to a resistive shim assembly 14 (which may also include a BO component which alters the value of the magnetic field) such that the current supplied to the resistive shim assembly 14 can be adjusted to substantially counterbalance the change in value of the magnetic field and its homogeneity resulting from a change in temperature of the passive shim assembly 12. An illustration of an embodiment of this invention is illustrated in FIG. 1.

The imaging system 10 includes an imaging magnet 16 that is constructed to form a magnet bore 18 within its center. A gradient coil 20 or coils may be positioned in combination with the imaging magnet 16 and are commonly positioned within the imaging magnet bore. The present invention, however, further includes a passive shim assembly 12 positioned within the magnet bore 18. A wide variety of passive shim assemblies 12 are contemplated by the present invention. One embodiment contemplates the use of iron pieces 22, such as iron ring elements, formed around a first cylindrical surface 24 positioned within the magnet bore 18. Other embodiments contemplate the use of a multitude of small localized pockets into which a controlled amount of iron 22 may be introduced. Often, for instance, a plurality of shim slots are utilized each adapted to accept a shim tray, which in turn can hold a plurality of individual passive shims 26. It should be understood that a plurality of such iron pieces 22 may be utilized and each may be considered an individual passive shim 26. These passive shims 26 are known to vary in their magnetization when their individual passive shim temperatures are varied. This is known to vary the magnetic field generated by the imaging magnet 16.

The present invention addresses the concern of temperature changes in the passive shim assembly 12 by further including a plurality of thermometers 28 that are thermally coupled to a select number of the plurality of passive shims 26. It should be understood that the thermometers 28 need not be coupled to every passive shim 26 but only a select number suitable for an accurate refection of temperature changers. In this fashion, the temperature of the passive shims 26 may be monitored. The term thermometer 28 is intended to encompass any of a wide variety of methods and devices designed or adapted for the monitoring of temperature and are not intended as a limitation of a specific instrument. Although a single thermometer 28 may be utilized for the plurality of passive shims 26, it is contemplated that the present invention may include a plurality of passive shim locations 30 and a thermometer 28 may be coupled to each of the plurality of passive shim locations 30. The number of total thermometers 28 and passive shim locations 30 may be utilized to vary the accuracy of the present system.

Figure 2:
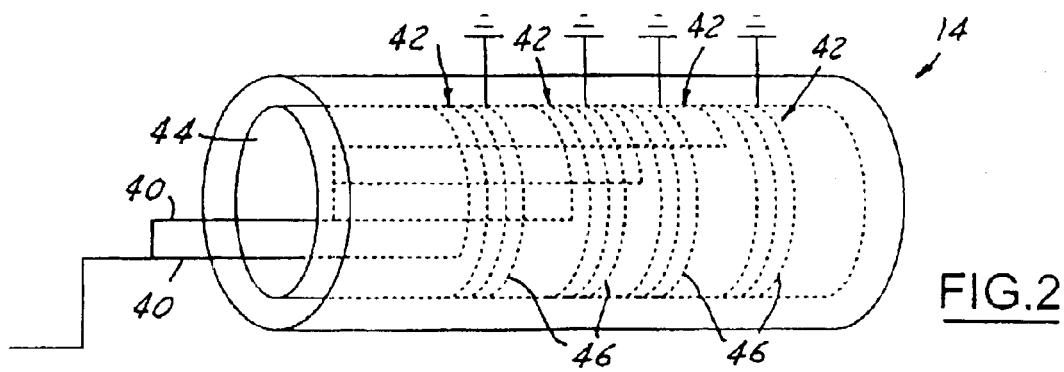
FIG. 2 is a detailed illustration of a plurality of resistive shims as described in FIG. 1.
Figure 3:
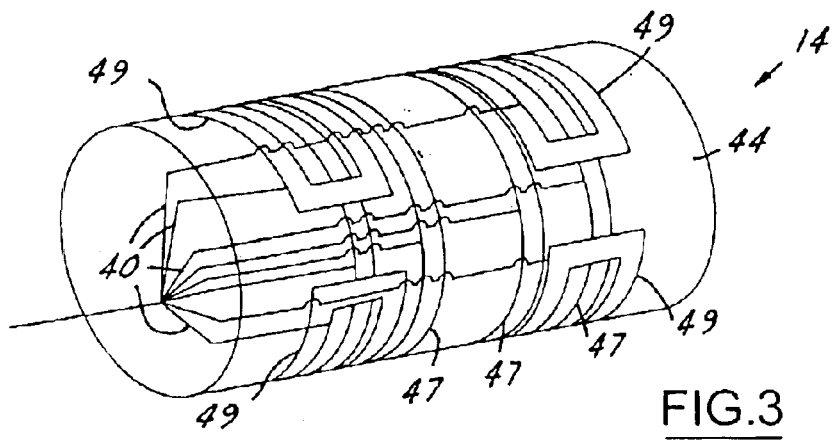
FIG. 3 is a detailed illustration of an alternate embodiment of the resistive shim assembly as described in FIG. 2.

Each of the plurality of thermometers 28 is in communication with a controller 32. The controller 32 may include a thermistor reader 34 with which to convert electrical impulses from the thermometers 28 into a plurality of passive shim temperatures 36. In alternative embodiments, however, a wide variety of known methodologies may be utilized to convert thermometer 28 readings into usable digital information. The controller 32 is further in communication with the resistive shim assembly 14. It is contemplated that the controller 32 may include a current driver 38 capable of controlling the control current 40 sent to each of the plurality of resistive shims 42 making up the resistive shim assembly 14. The control current 40 is utilized to counterbalance any magnetization change in the passive shims 26 due to temperature change. The resistive shim assembly 14 may be positioned on a second cylindrical surface 44 within the magnet bore 18 and within the first cylindrical surface The resistive shim assembly 14 may comprise a variety of resistive shims 46. The number and position of the resistive shims 46 can be modified to provide particular types of magnetic field corrections. One embodiment contemplates the use of a plurality of individual coils 46, such as copper coils, wired on independent circuits to the controller 32 such that individualized control currents 40 may be sent to each coil 46 (see FIG. 2). This allows for optimally maintaining the homogeneity of the magnet 16. In addition to the number of and placement of the individual coils 46 it is contemplated that the number of windings of each coil and precise placement of each individual coil 46 may be adjusted to fully optimize the present invention. The configuration of the individual coils 46 may also be varied. FIG. 3 illustrates the use of Z2 type resistive shim coils 47 as well as X-type resistive shim coils 49. It should be further understood that the gradient coil 20 may be placed in communication with the controller 32 such that the interaction of the gradient coil 20 and the resistive shims 46 with the passive shim assembly 12, or the magnet 16 or the conducting elements commonly comprising the cryostat 51, may additionally be addressed (see FIG. 1). Operation of the gradient coil 20 or resistive shims 46 can result in minor fluctuations of the magnetic field due to eddy currents flowing in the conductive elements comprising the cryostat 51. In this embodiment, the control current 40 sent to each of the resistive shims 42 may be further adjusted by the controller 32 to counterbalance the gradient coil 20 interference in addition to the thermal variations. A console element 48 may be placed in communication with the controller 32 to allow for user control over the imaging assembly 10 in addition to calibration controls.

Figures 4, 5:
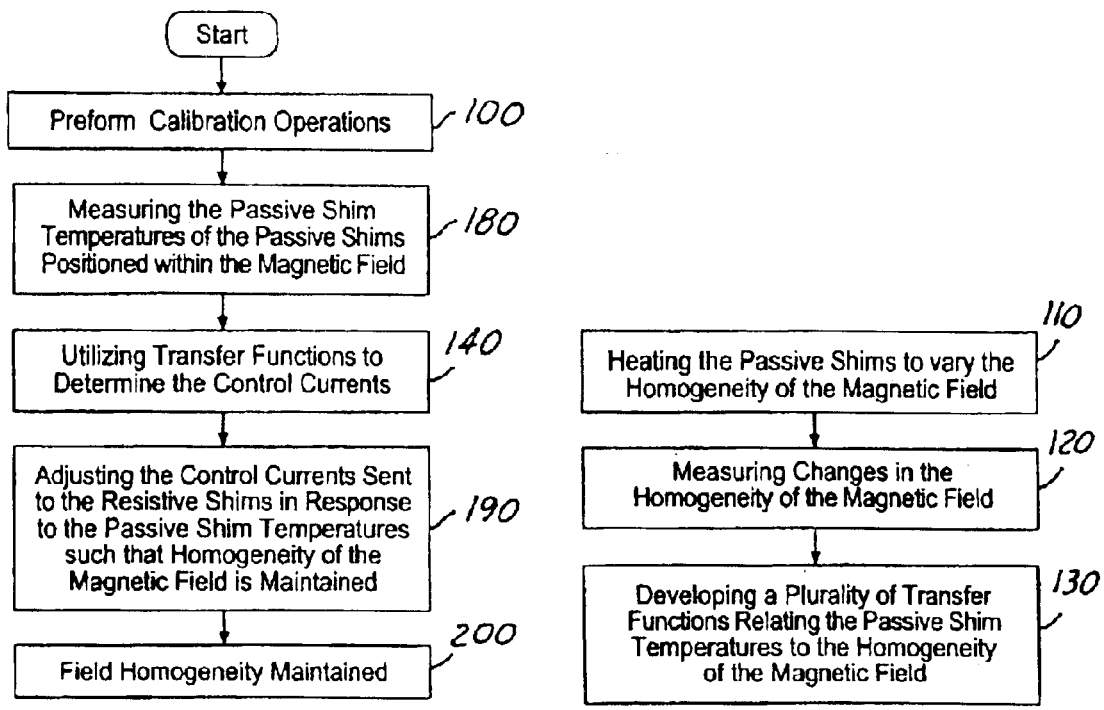
FIG. 4 is a flowchart depicting a method of controlling the homogeneity of a magnetic field within an imaging system in accordance with the present invention.
FIG. 5 is a flowchart depicting a method of calibrating the method illustrated in FIG. 4.

Although the structure of the present invention has been thus far described, it should be understood that a wide variety of variations may be developed to operate the present invention. One embodiment of the operational nature of the present invention is indicated by the flowchart in FIG. 4. The present invention begins by calibrating the imaging system 100. This may be accomplished in a variety of fashions. One embodiment illustrated in FIG. 5 contemplates heating the passive shims to vary the homogeneity of the magnetic field 110. This may be accomplished in a variety of fashions. The gradient coil 20 may be turned on and left on. Liquid cooling assemblies may be turned off or their flows reduced. External heating elements or devices may even be used to heat the passive shims. The deliberate alteration of the temperature gradients over the passive shims 26 allows for a deliberate alteration of the homogeneity of the magnetic field in response to the temperature alteration. The calibration therefore includes measuring changes in the homogeneity of the magnetic field 120. This may be accomplished using any of a wide variety of known procedures for measuring the magnetic field. A set of transfer functions is thus determined 130 between the temperature profile of the passive shims 26 and the effect on the magnet homogeneity. These transfer functions can be used to determine the current required in the resistive shims 140 (see FIG. 4) in order to optimally shim the magnet. This is accomplished by producing the reverse change that occurs due to the temperature effects on the passive shims 26.

Figure 6:
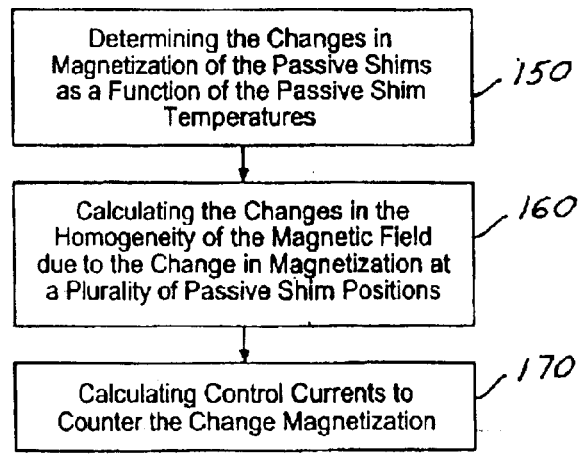
FIG. 6 is a flowchart depicting an alternative method of calibrating the method illustrated in FIG. 4.

In an alternative calibration procedure 100 illustrated in FIG. 6, a theoretical analysis can be performed to determine the effect on the magnet homogeneity of temperature changes in the passive shims. This requires determination of the change in magnetization of the passive shims as a function of passive shim temperature 150. This functional relationship can be determined experimentally. This functional relationship can be used in conjunction with a predictive tool, such as a computer program, that calculates the change in homogeneity of the magnetic field due to the change in magnetization at the points where the passive shims are located 160. Existing passive shimming software can be utilized to provide such predictive functions. From this predictive tool, the control currents necessary to counter the change in magnetization can be calculated 170. This methodology of correlating passive shim temperature to control current may be utilized in place of the previously described transfer function to accomplish the same result.

Once the imaging system 10 has been properly configured, a real time measurement of the passive shim temperatures 180 during operation of the imaging system 10 is performed. This allows a continuous monitoring of passive shim temperature. The present system can then utilize transfer functions to convert the passive shim temperatures into correlated control currents 140 appropriate to counter the alteration of the magnetic field due to the passive shim temperatures. It should be understood that in the case of predictive tool calibration, correlation tables or other functional relationships can be utilized in place of transfer functions as long as an accurate relationship between the passive shim temperatures and the required control currents required by the resistive shims to counter changes in the magnetic field is known. Once proper control currents have been determined, the control currents sent to the resistive shims are adjusted in response to the passive shim temperatures 190 such that magnetic field homogeneity is maintained 200. In this fashion, the present invention provides real time improvement of the magnetic field homogeneity and therefore contributes to improvement of image quality.

While particular embodiments of the invention have been shown and described, numerous variations and alternative embodiments will occur to those skilled in the art. Accordingly, it is intended that the invention be limited only in terms of the appended claims.

What is claimed is:

1. An imaging system comprising;
   an imaging magnet including a magnet bore;
   a plurality of passive shims positioned within said magnet bore;
   a plurality of resistive shims positioned within said magnet bore;

a plurality of thermometers coupled thermally to one or more of said plurality of passive shims, each of said plurality of thermometers reading a passive shim temperature;

a controller in communication with said plurality of thermometers and said plurality of resistive shims, said controller including logic adapted to adjust control currents sent to each of said plurality of passive shims in response to said resistive shim temperatures received from said thermometers such that magnetic homogeneity is maintained.

2. An imaging system as in claim 1 wherein said plurality of passive shims comprises:

a plurality of iron ring elements mounted to a first cylindrical surface.

3. An imaging system as in claim 1 wherein said plurality of resistive shims comprises:

a plurality of coils in electrical communication with said controller.

4. An imaging system as in claim 3 further comprising:

a first cylindrical sure positioned within said magnet bores said plurality of passive shims positioned on said first cylindrical surface; and a second cylindrical surface positioned within said first cylindrical surface, said plurality of coils positioned on said second cylindrical surface.

5. An imaging system as in claim 1 wherein said logic is further adapted to:

develop a first transfer function relating one of said passive shim temperatures to said magnetic homogeneity; and utilize said first transfer function to determine one of said control currents; and send said control current to one of said plurality of resistive shins.

6. An imaging system as in claim 1 wherein each of said plurality of passive shims includes a plurality of passive shim locations, one of said plurality of thermometers thermally coupled with each of said plurality of passive shim locations.

7. An imaging system as in claim 1 wherein each of said plurality of resistive shims is wired on independent circuits to said controller.

8. An imaging system comprising:

an imaging magnet including a magnet bore;

a passive shim positioned within said magnet bore;

a resistive shim positioned within said magnet bore;

a thermometer coupled thermally to said passive shim, said thermometer measuring a passive shim temperature;

a controller in communication with said thermometer and said resistive shim, said controller including logic adapted to adjust a control current sent to said resistive shim in response to said passive shim temperature received from said thermometer such that magnetic homogeneity is maintained.

9. An imaging system as in claim 8 wherein said passive shim comprises:

a plurality of iron pieces mounted on a first cylindrical surface.

10. An imaging system as in claim 8 further comprising;

a gradient coil assembly in communication with said controller, said logic adapted to adjust said control current in order to compensate for eddy currents generated by said gradient coil assembly.

11. An imaging system as in claim 8 wherein said resistive shim comprises:

a plurality of copper coils in electrical communication with said controller.

12. An imaging system as described in claim 8, further comprising:

a plurality of iron ring elements forming said passive shim; and a plurality of coils forming said resistive shim.

13. An imaging system as in claim 11 further comprising:

a first cylindrical surface positioned within said magnet bore, said passive shim positioned on said first cylindrical surface; and a second cylindrical surface positioned within said first cylindrical surface, said plurality of copper coils positioned on said second cylindrical surface.

14. An imaging system as in claim 8 wherein said thermometer comprises a plurality of thermometers coupled thermally to a plurality of passive shim locations on said passive shim.

15. An imaging system as in claim 8, wherein said logic is further adapted to:

develop a transfer function relating said temperatures to said magnetic homogeneity; and utilizing said transfer function to determine said control current sent to said resistive shim.

16. A method of controlling the homogeneity of a magnetic field generated by an imaging system comprising:

measuring the passive shim temperances of a plurality of passive shims positioned within the magnetic field;

adjusting a plurality of control currents sent to a plurality of resistive shims positioned within the magnetic field in response to said plurality of passive shim temperatures such that the homogeneity of the magnetic field is maintained.

17. A method of controlling the homogeneity of a magnetic field generated by an imaging system as described in claim 16, further comprising:

utilizing a plurality of transfer functions to determine said plurality of control currents, said plurality of transfer functions relating said passive shim temperatures to the homogeneity of the magnetic field.

18. A method of controlling the homogeneity of a magnetic field generated by an imaging system as described in claim 17, further comprising:

heating said plurality of passive shims to vary the homogeneity of the magnetic field, measuring changes in the homogeneity of the magnetic field; and developing a plurality of transfer functions relating said passive shim temperatures to the homogeneity of the magnetic field.

19. A method of controlling the homogeneity of a magnetic field generated by an imaging system as described in claim 16, further comprising:

determining the change in magnetization of said plurality of passive shims as a function of said passive shim temperatures;

calculating the change in the homogeneity of the magnetic field due to said change in magnetization at a plurality of passive shim positions.

20. A method of controlling the homogeneity of a magnetic field generated by an imaging system as described in claim 19, further comprising:

calculating said plurality of control currents to counter said change in magnetization;

sending said plurality of control currents to said plurality of resistive shims.

* * * * *

UNITED STATES PATENT AND TRADEMARK OFFICE
CERTIFICATE OF CORRECTION

| | |
|---|---|
| PATENT NO. | : 6,788,060 B1 |
| APPLICATION NO. | : 10/250014 |
| DATED | : September 7, 2004 |
| INVENTOR(S) | : Peter Feenan et al. |

It is certified that error appears in the above-identified patent and that said Letters Patent is hereby corrected as shown below:

Claim 4:
Column 5, Line 19, should read as follows: --a first cylindrical surface positioned within said magnet bore--

Claim 16:
Column 6, Line 26, should read as follows: --measuring the passive shim temperatures of a plurality of--

Signed and Sealed this

First Day of May, 2007

JON W. DUDAS
*Director of the United States Patent and Trademark Office*